(12) United States Patent
Spokoyny et al.

(10) Patent No.: US 10,168,112 B2
(45) Date of Patent: Jan. 1, 2019

(54) HEAT EXCHANGING APPARATUS AND METHOD FOR TRANSFERRING HEAT

(71) Applicant: Cool Technology Solutions, Inc., San Diego, CA (US)

(72) Inventors: Mikhail Spokoyny, Santa Clara, CA (US); Nick Ortenberg, San Diego, CA (US)

(73) Assignee: Cool Technology Solutions, Inc., San Diego, CA (US)

( * ) Notice: Subject to any disclaimer, the term of this patent is extended or adjusted under 35 U.S.C. 154(b) by 649 days.

(21) Appl. No.: 14/416,445

(22) PCT Filed: Jul. 26, 2013

(86) PCT No.: PCT/US2013/052176
§ 371 (c)(1),
(2) Date: Jan. 22, 2015

(87) PCT Pub. No.: WO2014/018824
PCT Pub. Date: Jan. 30, 2014

(65) Prior Publication Data
US 2015/0176927 A1    Jun. 25, 2015

Related U.S. Application Data

(60) Provisional application No. 61/676,164, filed on Jul. 26, 2012.

(51) Int. Cl.
*F28F 13/12* (2006.01)
*F28F 13/02* (2006.01)
(Continued)

(52) U.S. Cl.
CPC .......... *F28F 13/02* (2013.01); *H01L 23/4735* (2013.01); *B01F 5/0268* (2013.01);
(Continued)

(58) Field of Classification Search
CPC .......... F28F 13/12; F28F 13/125; F28F 13/02; B01F 5/0268; B01F 5/02; H01L 23/473; H01L 23/4735
(Continued)

(56) References Cited

U.S. PATENT DOCUMENTS 2,361,150 A * 10/1944 Petroe .................. B01F 5/0451
366/173.1
4,264,212 A * 4/1981 Tookey ................. B01F 5/0403
366/173.1
(Continued)

OTHER PUBLICATIONS

International Search Report and Written Opinion completed Oct. 23, 2013, from corresponding International Application No. PCT/US2013/052176.

*Primary Examiner* — Leonard R Leo
(74) *Attorney, Agent, or Firm* — Gardner, Linn, Burkhart & Ondersma LLP

(57) ABSTRACT

A jet-flow heat exchanging device for transferring heat from or to one or more heat transfer surfaces comprises one or more orifice groups, each for directing a heat carrier medium onto the heat transfer surface with at least one of the orifice groups including a main orifice for generating a main jet-stream, and at least two control orifices associated with the main orifice and configured to generate control jet-streams for interacting with the main jet-stream, so as to cause the heat carrier medium of the main jet-stream to swirl.

13 Claims, 15 Drawing Sheets

(51) Int. Cl.
*H01L 23/473* (2006.01)
*B01F 5/02* (2006.01)
*F28D 21/00* (2006.01)

(52) U.S. Cl.
CPC ...... *F28D 2021/0028* (2013.01); *F28F 13/12* (2013.01); *H01L 2924/0002* (2013.01)

(58) Field of Classification Search
USPC ............... 165/80.4, 908; 366/173.1; 361/699
See application file for complete search history.

(56) References Cited

U.S. PATENT DOCUMENTS

| | | | |
|---|---|---|---|
| 4,734,109 A * | 3/1988 | Cox | B01F 5/02 95/189 |
| 5,063,476 A * | 11/1991 | Hamadah | H01L 23/467 257/E23.099 |
| 5,220,804 A | 6/1993 | Tilton et al. | |
| 5,719,444 A | 2/1998 | Tilton et al. | |
| 5,814,125 A * | 9/1998 | Anderson | B01F 3/0473 75/414 |
| 6,105,373 A * | 8/2000 | Watanabe | F25B 21/02 62/3.7 |
| 6,973,805 B2 * | 12/2005 | Higashiyama | F25B 39/022 165/174 |
| 7,490,661 B2 * | 2/2009 | Nishino | F25B 39/028 165/174 |
| 7,787,248 B2 * | 8/2010 | Campbell | H01L 23/427 165/908 |
| 9,861,942 B1 * | 1/2018 | Paul | B01F 3/04446 |
| 2003/0172669 A1 | 9/2003 | Tilton et al. | |
| 2007/0272392 A1 | 11/2007 | Ghosh et al. | |
| 2011/0042041 A1 | 2/2011 | Zrodnikov et al. | |
| 2012/0048515 A1 * | 3/2012 | Bhunia | H01L 23/4735 165/104.25 |

* cited by examiner

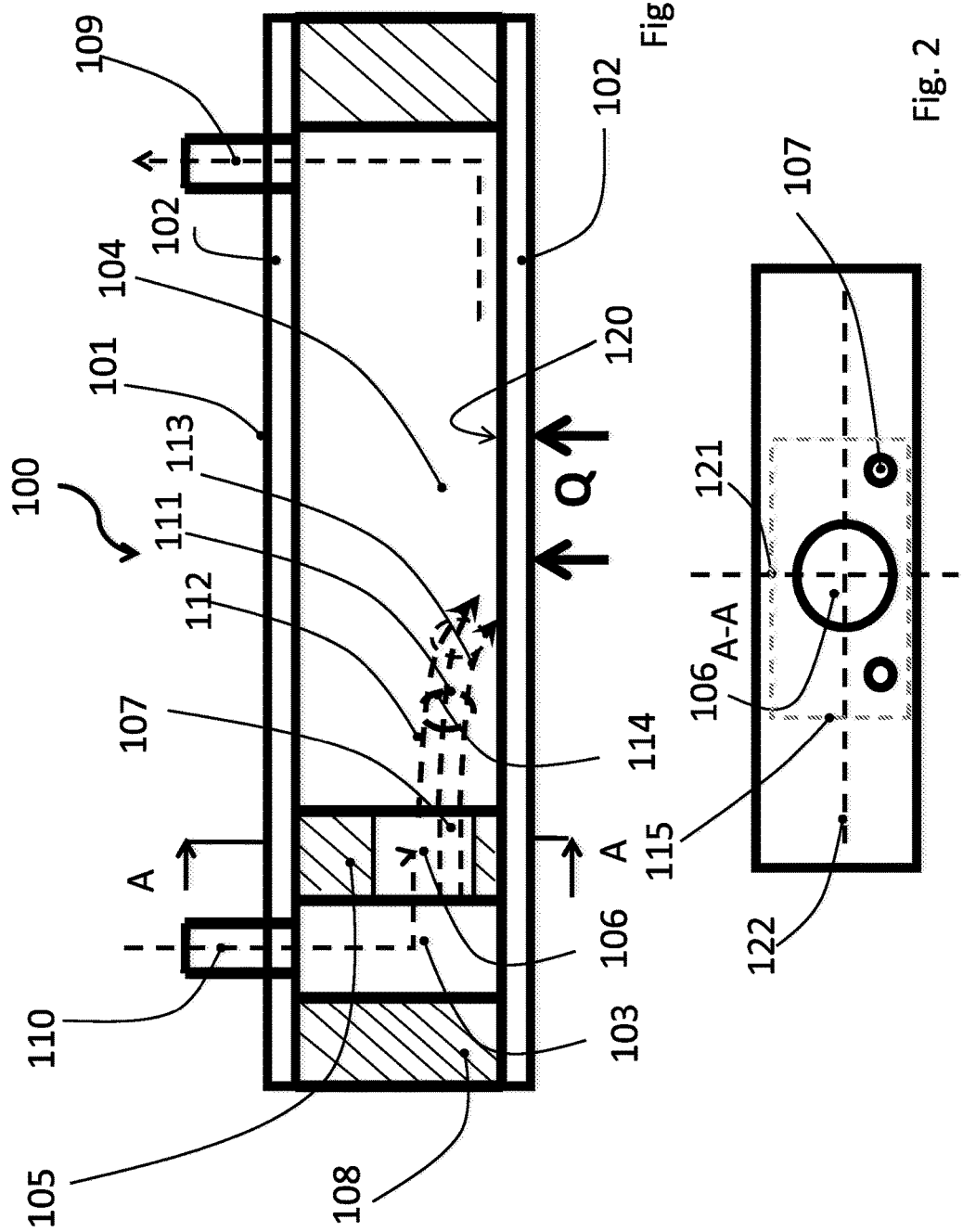

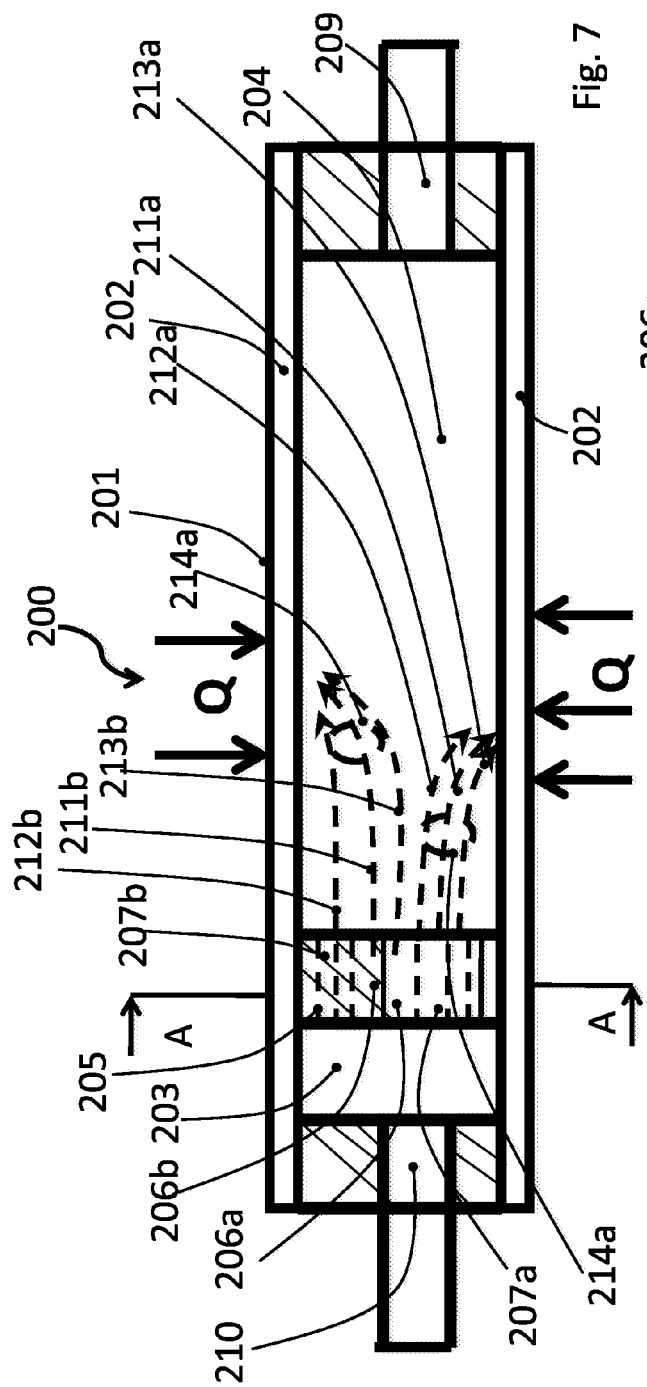
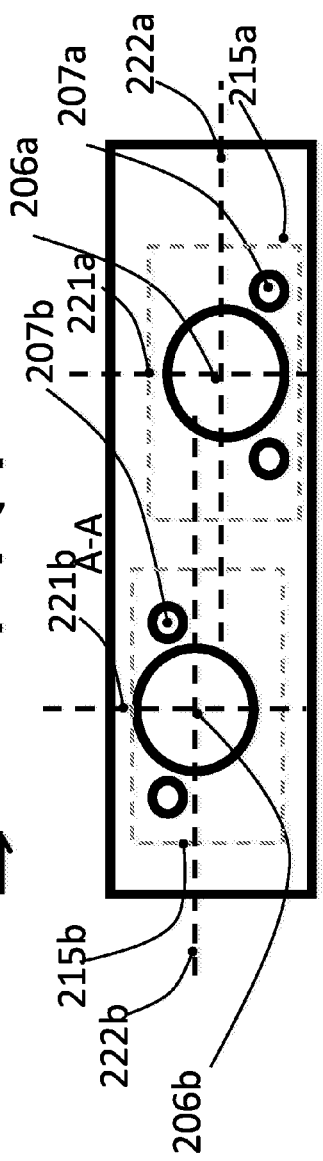
Fig. 7
Fig. 8

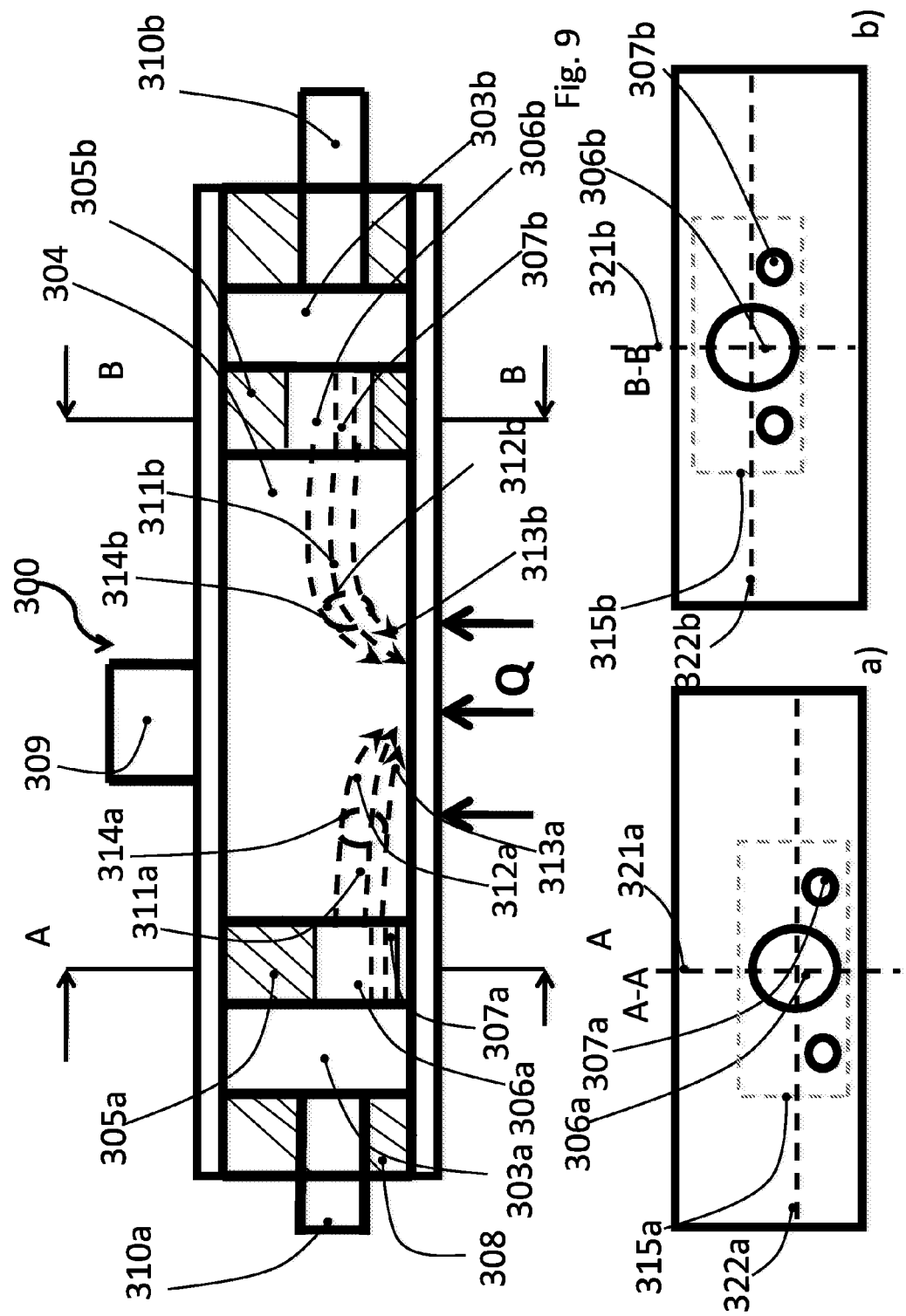

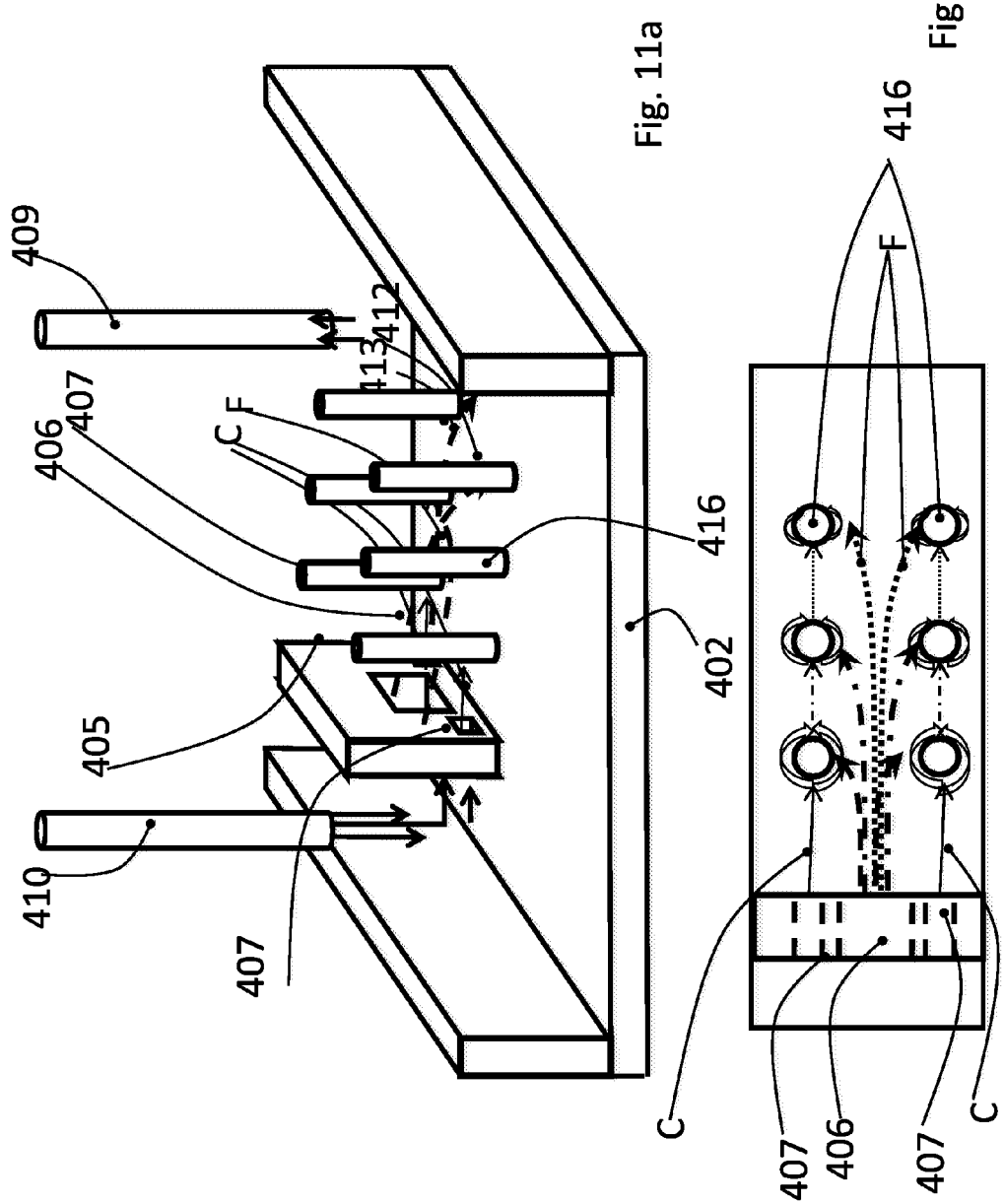

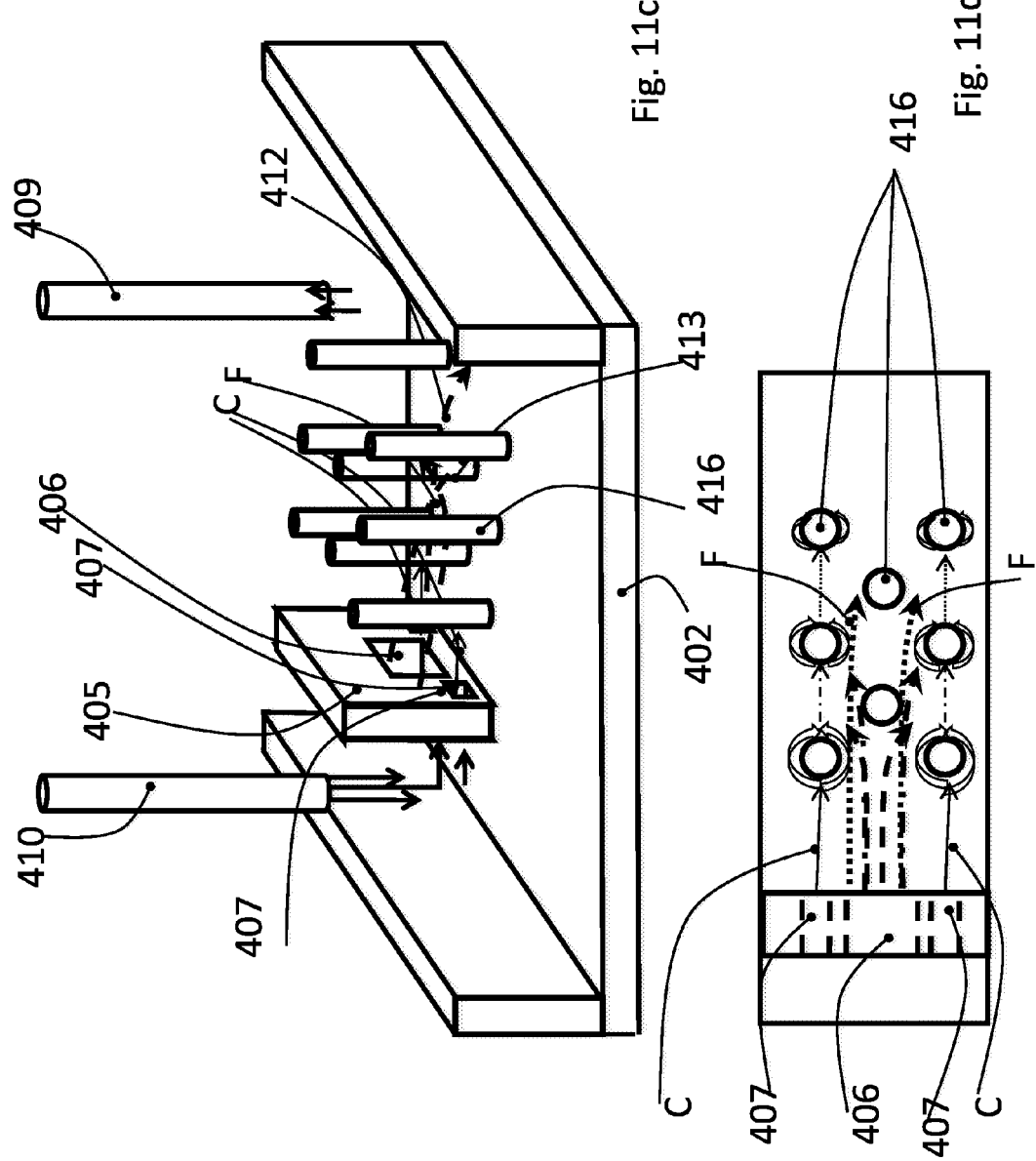

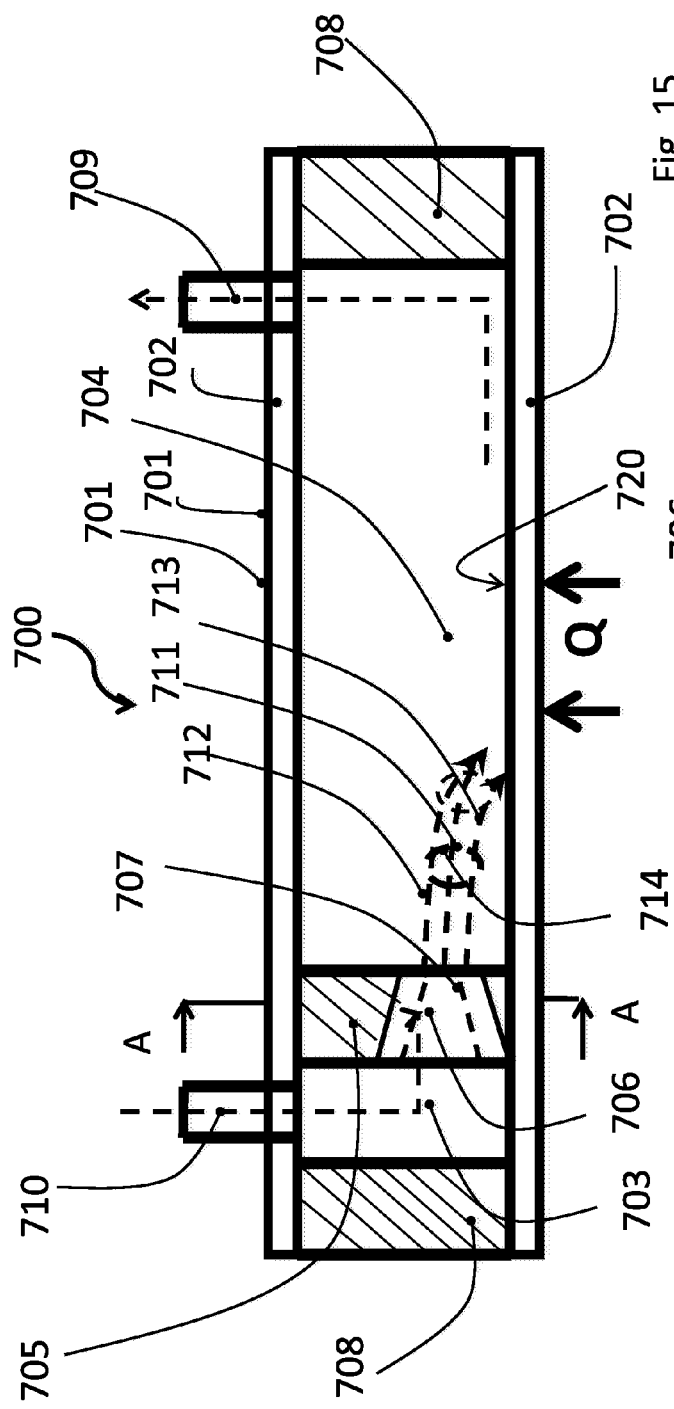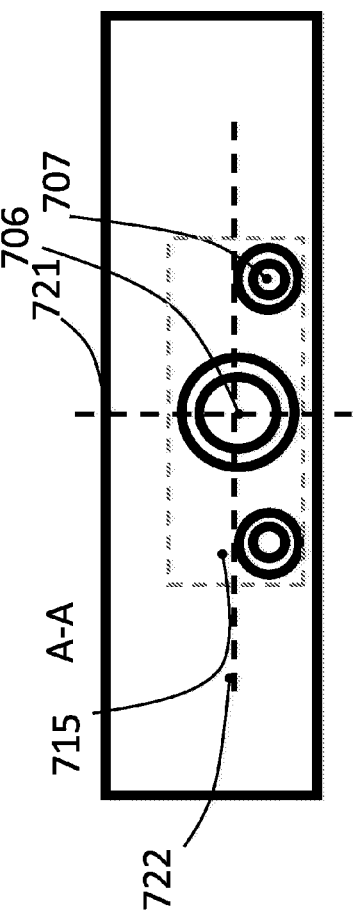
Fig. 15
Fig. 16

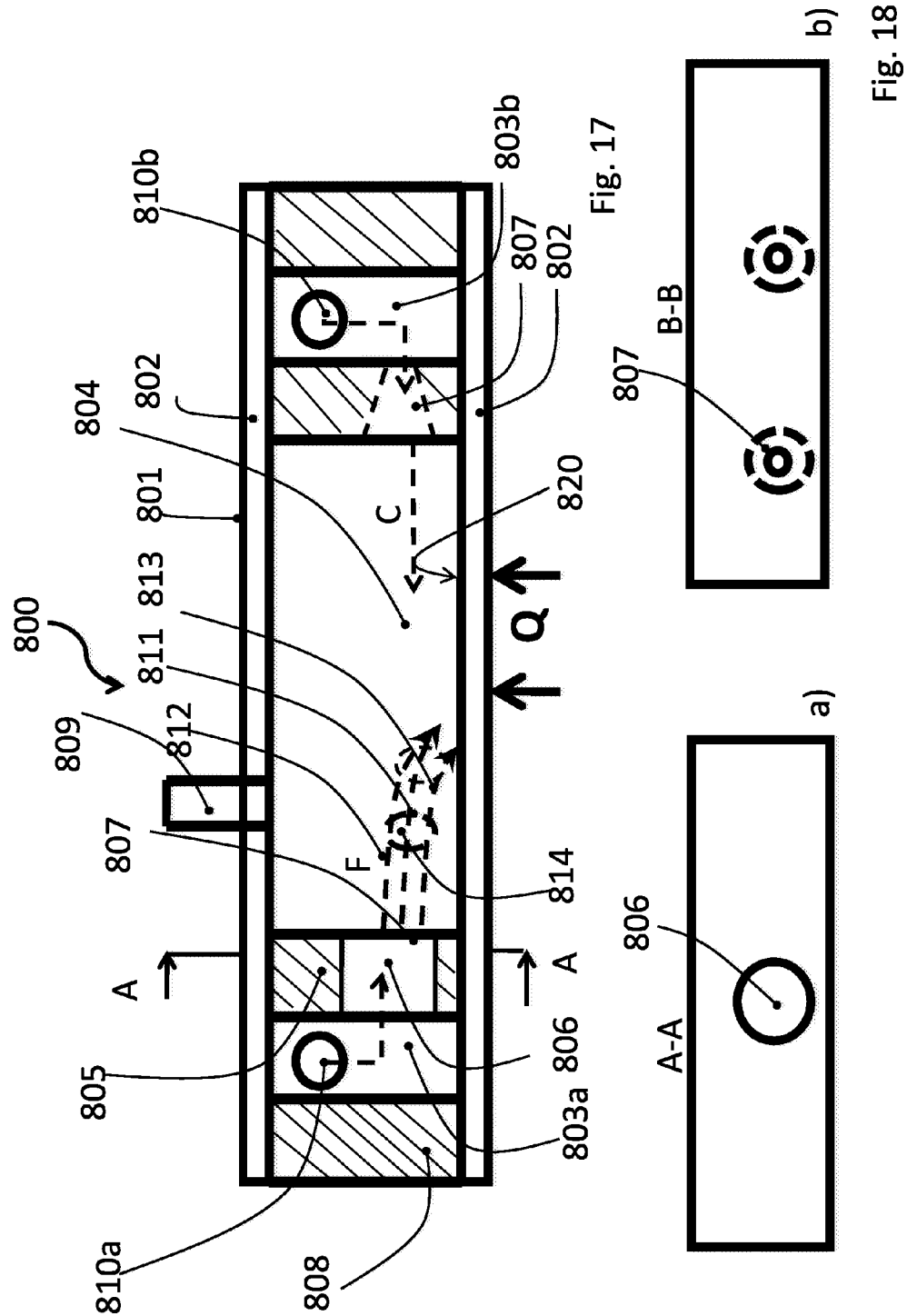

HEAT EXCHANGING APPARATUS AND METHOD FOR TRANSFERRING HEAT

CROSS REFERENCE TO RELATED APPLICATION

The present application claims the priority benefits of International Patent Application No. PCT/US2013/052176, filed on Jul. 26, 2013, and claims benefit of U.S. provisional patent application U.S. application Ser. No. 61/676,164, filed on Jul. 26, 2012, which are hereby incorporated by reference in their entireties.

BACKGROUND OF THE INVENTION

The present invention relates to an apparatus and a method for transferring heat between one or more heat transfer surfaces and a heat carrier medium in either a liquid or two-phase state, particularly for cooling of electronic devices.

Heat dissipation in technical devices, particularly in electronic devices such as power electronic devices, microprocessors or lasers, imposes serious issues regarding the design of technical systems, particularly with respect to system integration and performance. To avoid overheating of these devices, cooling measures are commonly applied. Owing to the increasing power density of such devices, cooling methods have steadily developed.

Most technical systems, in which cooling of a high-power density device is required, utilize a cooling medium that is forced to stream over a cold plate of a device or a surface coupled thereto, so that heat dissipated by the high-power density device is transferred to the cooling medium.

In contrast to air as a heat carrier medium, usage of liquids requires creation and organization of passageways within enclosed volume of a heat exchanging apparatus. Hence, such apparatuses become increasingly complex as the amount of thermal energy to be transported increases. Usually increase of heat exchange efficiency is achieved by turbulization of the flow that causes higher hydrodynamic losses within a cooling device. In view of a minimum flow rate required for transporting heat away from or towards to a serviced device, these hydrodynamic losses negatively affect the system, requiring bigger, more powerful pumps, increasing system's noise level and power consumption, and decreasing its reliability and uptime.

As increasing the transfer surface between the cooling liquid and the device to be cooled turned out not to be sufficient in high-power density devices, new techniques have been developed recently to cope with managing high heat densities of devices to be cooled. For instance, synthetic jets have been developed which are based on piezoelectric vibrations applied to the cooling liquid.

Furthermore, impingement jets are used which include jet streams of a cooling medium that are directed to a heat transfer surface. The cooling medium experiences a significant turbulization in the vicinity of the heat transfer surface which might result in an uneven heat transfer from the heat transfer surface, so that localized hot spots with reduced heat transfer characteristics will occur. This effect is even more dominant for higher jet velocities and/or inlet pressures.

For lower velocities, impingement jets have a more laminar flow with no or a low swirling tendency and therefore only a low heat transfer rate to the cooling medium due to the formation of a boundary layer between the jet and the heat transfer surface is obtained.

Artificial turbulization of the flow inside heat exchanger allows to achieve heat transfer rates common for turbulent flow at much lower velocities, and therefore with much less energy and much higher reliability. To achieve such an effect the swirling of a jet is essential. In document US 2011/0042041 A1, this has been achieved by directing jets with opposite flow directions over a heat dissipation surface in an interleaved, i.e. in a comb-shaped manner, so that the jets pass side by side with neighboring jets having transverse flow directions. Between two neighboring jets, vortices are generated which destroy the boundary layers between the jet and the heat dissipation surface and thereby improve the heat dissipation. However, the hydrodynamic losses are high due to alternating streams and a complex structure requiring low tolerance is necessary for generating those interleaved jets.

In view of the above, it is desirable to provide a heat transfer from or to a heat transfer surface by means of a heat carrier medium in a liquid or a two-phase state flowing along the heat transfer surface while providing low hydrodynamic losses and uniform heat flow rate, i.e. by avoiding local hot spots.

SUMMARY OF THE INVENTION

Embodiments of the present invention are indicated by a jet-flow heat exchanging device for transferring heat from or to one or more heat transfer surfaces, as well as systems and methods, embodiments of which are discussed herein.

According to a first aspect, a jet-flow heat exchanging device for transferring heat from or to one or more heat transfer surfaces is provided, comprising:
 one or more orifice groups, each for directing a heat carrier medium onto the heat transfer surface;
 wherein at least one of the orifice groups includes:
  a main orifice for generating a main jet-stream; and
  two or more control orifices associated with the main orifice and configured to generate control jet-streams for interacting with the main jet-stream, so as to cause the heat carrier medium of the main jet-stream to swirl.

One idea of the above jet-flow heat exchanging apparatus is to provide at least one main jet-stream and two respectively associated control jet-streams substantially flowing in parallel, wherein the control jet-streams are arranged in proximity of or around the main jet-stream to allow interacting with the main jet-stream so as to cause the heat carrier medium, such as a cooling medium, a coolant and the like, to swirl. This swirling occurs because the main jet-stream dynamically changes its direction so as to wipe irregularly across an area of the heat transfer surface in a fan-like manner, wherein the area is substantially larger than the area which would be covered by the main jet-stream without the existence of the control jet-streams. Thereby turbulization is achieved, i.e. a heat-transfer process which involves the interaction of a heat transfer surface with a surrounding fluid while a boundary layer is destroyed in order to intensify the convective heat transfer. Furthermore, local static vortices and the like, where hot spots might occur, can be avoided. Instead, the flow direction of the main jet-stream is dynamically curved and forced to swing with sudden movements transversely to the main flow direction.

Furthermore, the flow direction of the one or more control jet-streams may be substantially equal to the flow direction of the main jet.

According to an embodiment, an area of a cross-section of one or more control orifices may have a size of about 1 to 60% of the area of the cross-section of an opening of the main orifice that is directed to the heat transfer surface.

It may be provided that the one or more control orifices are distanced from the main orifice by between 1% and 50% of a largest cross-sectional dimension of the main orifice.

Furthermore, the two or more control orifices may be symmetrically arranged around the associated main orifice, wherein the symmetry is at least with respect to a first cross-axis of the main orifice, wherein the first cross-axis is, in particular, substantially perpendicular to the heat transfer surface.

Alternatively, three or more control orifices may be symmetrically arranged around the main orifice of a respective orifice group, wherein symmetry lines go through the geometrical center of the main orifice the number of which corresponds to the number of control orifices associated to the main orifice.

Moreover, wherein at least two of the control orifices are offset from a selected one of the symmetry lines or a further symmetry line through the main orifice towards the heat transfer surface, wherein the two control orifices are located between the selected or further symmetry line and the heat transfer surface, causing the main jet stream to flow in a curved manner towards the heat transfer surface.

According to an embodiment, each of the main orifices and each of the control orifices of each orifice group have a cross-section selected from a square, rectangular, triangular, circular and elliptical cross-section.

The main orifice within an orifice group may be of any shape in any orientation. Shape, size, and orientation (of the cross-sectional shape with respect to the flow direction) of the main orifice are dictated by the shape, size and location of the local spot onto heat transfer surface that this particular orifice group is servicing.

Each control orifice within an orifice group may be of any shape in any orientation. Shape, size, and orientation of each control orifice are dictated by the shape, size and location of the local spot onto heat transfer surface that this particular orifice group is servicing.

It may be provided that at least one of the main orifices and/or one or more of the control orifices within at least one of the orifice groups are tapered. Depending on a particular goal an orifice can be tapered either in the downstream or in the upstream direction.

According to an embodiment, one or more orifice groups may be supplied by an inlet manifold having a common volume to supply the heat carrier medium to each orifice within each orifice group under substantially the same pressure.

Furthermore, one or more of the orifice groups are incorporated in a orifice plate in a straight alignment extending substantially parallel to the heat transfer surface.

Moreover, one or more of the heat transfer surfaces are included in an enclosure through which the heat carrier medium is passed.

One or more of the heat transfer surfaces may include one or more protrusions and/or one or more dimples arranged relative to one of the orifice groups, so that the main jet-stream of at least one of the orifice groups engages with the one or more protrusions and/or the one or more dimples.

Furthermore, it may be provided that arrangements of one or more aligned pins are located downstream of at least one of the control orifices of at least one of the orifice groups along the control jet-stream path, and/or wherein arrangements of one or more aligned pins are located downstream of the main orifice of at least one of the orifice groups along the main jet-stream path.

Moreover, one or more chambers may be provided which include one or more heat transfer surface, wherein the one or more chambers are limited by at least one orifice plate including the one or more orifice groups.

Particularly, a plurality of chambers may be arranged within an enclosure of a housing of the device either in series or in parallel or in a combination of parallel and serial arrangement.

According to a further aspect, a system is provided comprising:
 the above device; and
 an element providing the heat transfer surface or being thermally coupled to the heat transfer surface.

According to a further aspect, a method for transferring heat from or to one or more heat transfer surfaces is provided, comprising the steps of:
 providing a main jet-stream of a heat carrier medium in liquid or two-phase state that is directed onto the heat transfer surface; and
 providing at least two control jet-streams for interacting with the main jet-stream, so as to cause heat carrier medium to swirl.

BRIEF DESCRIPTION OF THE DRAWINGS

Embodiments are described in more detail in conjunction with the accompanying drawings, in which:

FIG. 1 shows a cross-sectional view of a first heat exchanging apparatus;

FIG. 2 shows a cross-sectional view of an orifice arrangement for providing a main jet-stream and two control jet-streams;

FIG. 7 shows a cross-sectional view of a second heat exchanging apparatus with two heat transfer surfaces;

FIG. 8 shows a cross-sectional view of the orifice groups for the second heat exchanging apparatus of FIG. 7;

FIG. 9 shows a cross-sectional view of a third heat exchanging apparatus;

FIGS. 10a and 10b show orifice groups for generating opposing swirling jet streams differently distanced from the heat transfer surface;

FIG. 11a shows a perspective cross-sectional view of one type of the fourth heat exchanging device with pins as structure of the heat transfer surface located in the flow path of the control jet-streams;

FIG. 11b shows a top cross-sectional view on the heat exchanging device of FIG. 11a;

FIG. 11c shows a perspective cross-sectional view of another type of the fourth heat exchanging device with pins as structure of the heat transfer surface located in the flow path of the control jet-streams and pins located in the flow path of the main jet-stream;

FIG. 11d shows a top cross-sectional view on the heat exchanging device of FIG. 11c;

FIG. 12 shows a cross-sectional view of a fifth heat exchanging apparatus with two heat transfer surfaces;

FIGS. 13a and 13b show the arrangements of outlet arrangements for providing two opposing swirling jet streams;

FIG. 15 shows a cross-sectional view of a seventh heat exchanging apparatus, wherein the cross-section of the orifices is tapered;

FIG. 16 shows a cross-sectional view of the orifice plate of the seventh heat exchanging apparatus of FIG. 15;

FIG. 17 shows a cross-sectional view of an eighth heat exchanging apparatus providing a main jet-stream and control jet-streams flowing in opposite directions; and FIGS. 18a and 18b show the cross-sectional views of the orifice plates for generating main jet-stream and control jet-streams flowing in opposite directions.

DETAILED DESCRIPTION

Figure 3:
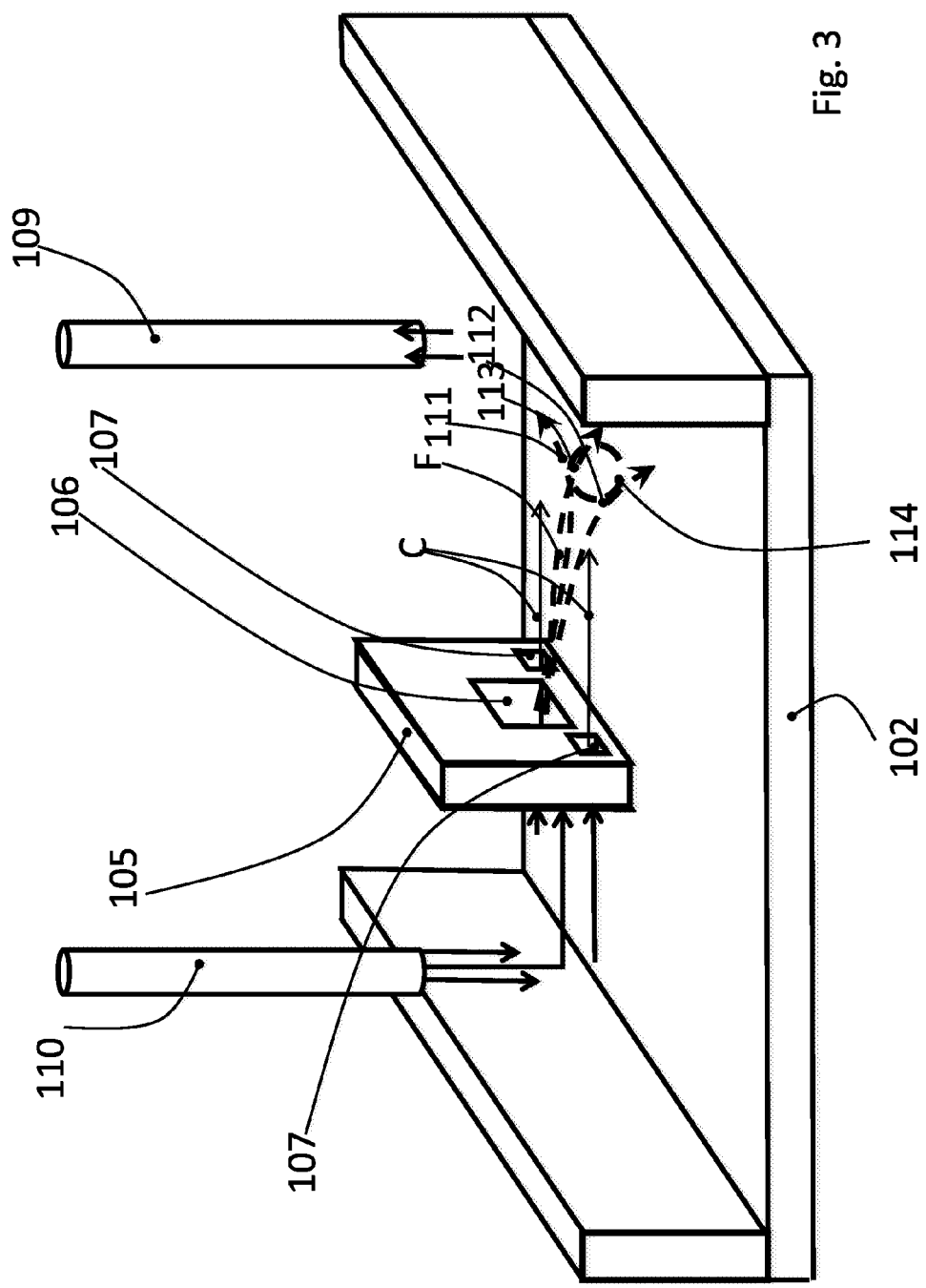
FIG. 3 shows a perspective cross-sectional view of a heat exchanging apparatus illustrating the flow direction of the main jet-stream in the embodiment of FIG. 1.

FIG. 1 shows a cross-sectional view depicting an exemplary embodiment of a first heat exchanging apparatus 100 having a housing 101. The housing 101 may be formed by two housing plates 102 being spaced apart by an enclosure element 108 encompassing a chamber 104 to form an enclosure with a closed volume.

One of the housing plates 102 forming the housing 101 is provided as a thermal coupling wall having a high thermal conductivity. The thermal coupling wall is used for coupling to a device from or to which heat shall be transferred, such as a heat source device, e.g. an electronic semiconductor device or an integrated circuit device. The thermal coupling wall has an inner surface which serves as a heat transfer surface 120.

A heat carrier medium in either liquid, such as water, or ethylene glycol, or propylene glycol, or two-phase state (liquid-gas or liquid-vapor) is forced to flow through the chamber 104 of the housing 101. The heat carrier medium can be a coolant or a cooling liquid.

The heat carrier medium is supplied to the first heat exchanging apparatus 100 through the supply port 110 and is discharged from the chamber 104 through the discharge port 109. The supply port 110 and the discharge port 109 are fed through one of the housing plates 102. In the present example, the supply port 110 and the discharge port 109 are fed through the housing plate 102 which is not carrying the heat transfer surface 120. Alternatively, the supply port 110 and the discharge port 109 might be fed through enclosure element 108

Within the housing 101, an inlet manifold 103 is formed by partitioning the enclosure within the housing 101 by means of an orifice plate 105. So the chamber 104 and the inlet manifold 103 form different partitions of the enclosure of the housing 101. The inlet manifold 103 is directly connected to the inlet of the supply port 110.

The orifice plate 105 provides through-holes 106, 107 connecting the inlet manifold 103 to the chamber 104. The through-holes 106, 107 are configured to form orifices, so that the heat carrier medium in the inlet manifold 103, which is forced to flow through the through-holes 106, 107 in the orifice plate 105, forms a jet-stream of the heat carrier medium in the chamber 104. In the present embodiment the through-holes are substantially cylindrically in shape.

The orifice plate 105 comprises one or more orifice groups 115, one type of which is exemplarily shown in FIG. 2. FIG. 2 shows a cutout cross-sectional view of the orifice plate 105 along the cutting plane A-A. The illustrated orifice group 115 comprises a main orifice 106 (also referred to as main nozzle) as one type of through-hole and two control orifices 107 (also referred to as supplementary nozzle) as another type of the through-holes arranged around the main orifice 106.

The control orifices 107 have a substantially smaller cross-section area (perpendicular to the flow axis) which may be about 10% of the cross-section area of the main orifice 106. Generally, the cross-section area of the control orifices 107 may be about 1% to 50% of the cross-section area of the main orifice 106, preferable 5% to 30%, more preferred 10% to 20%.

The distance (center to center) between the main orifice 106 and the control orifices 107 is between 1% and 80% of a largest cross-sectional dimension of the main orifice, particularly between 1% and 50%, particularly between 1% and 30%, particularly between 5% and 20%.

Furthermore, the control orifices 107 are arranged symmetrically around a first axis (first symmetry line) 121 through a (geometrical) center of the main orifice 106, wherein the first axis 121 is perpendicular to the flow direction through the main orifice 106 and perpendicular to the heat transfer surface 120 in the chamber 104.

Furthermore, a second axis (second symmetry line) 122 going through the center of the main orifice 106 and being perpendicular to the first axis 121 and to the flow direction is provided, wherein the control orifices 107 are offset from the second axis 122 towards the heat transfer surface 120.

Although only one orifice group 115 is depicted in FIG. 2, a plurality of orifice groups 115 can be provided in the orifice plate 105 which are arranged along the orifice plate 105 along the direction of the heat transfer surface 120. Particularly, the plurality of orifice groups 115 can be provided in the orifice plate 105 and be aligned in parallel to the heat transfer surface 120.

In operation, a heat carrier medium ant is supplied via the supply port 110 to pass via the inlet manifold 103 and through the orifices 106, 107 in the orifice plate 105 to the chamber 104. After being received in the chamber 104, the heat carrier medium is discharged through a discharge port 109 carrying away heat received from the heat transfer surface 120.

In FIG. 3, a perspective view of the interior of the housing 101 of the first heat exchanging apparatus 100 is shown. It can be seen that a portion of the orifice plate 105 separates the inlet manifold 103 and the chamber 104. The orifice plate 105 is illustrated with one exemplary orifice group 115 having one main orifice 106 and two laterally displaced control orifices 107. In this merely exemplary embodiment, both the cross-sections of the main orifice 106 and the control orifices 107 have a rectangular shape.

When heat carrier medium is supplied via the supply port 110, the inlet manifold 103 is pressurized, so that the heat carrier medium is forced to flow through the main orifice 106 and the control orifices 107 with substantially the same pressure. The heat carrier medium flowing through the main orifice 106 forms a main jet-stream indicated by the dashed arrows F and the heat carrier medium flowing through the control orifices 107 forms control jet-streams indicated by the dashed lines C. The present arrangement of the control orifices 107 in association with the main orifice 106 exhibits two important effects:

1. The control jet-streams C generated by the control orifices 107 cause a constant dynamic pressure imbalance with respect to the main jet-stream F. Since the control jet-streams C are in proximity to the main jet-stream F, the pressure imbalances interact with the main jet stream F, so that the main jet-stream F alternatively swings between stream paths 111, 112 and 113 creating the swirling jet 114 or vortexes, respectively. Basically, the degree of turbulization of the main jet-stream depends on the thickness of the jet-streams, their velocities and the distances between the main jet stream and the control jet-streams.
2. Due to the offset from the second axis 122 through the main orifice 106, the control orifices 107 generating control jet-streams C with a lower flow rate partly decelerate the main jet-stream F, so that the main jet-stream F is bent or respectively curved towards the direction of the displacement offset of the control orifices 107, i.e. in the direction towards the heat transfer surface 120.

FIGS. 4a to 4k show different configurations of orifice groups 115 including the main orifice 106 and the control orifices 107 to be arranged in the orifice plate 105. In contrast to the orifice group 115 shown in FIG. 2, the orifice groups 115 differ with respect to the cross-sectional shape of the orifices, the displacement of the whole orifice group 115 with respect to the heat transfer surface 120, the orientations of the cross-sectional shapes of the main orifice 106 and/or the control orifices 107, and the offset of the control orifices 107 with respect to the second axis 122.

Figure 4:
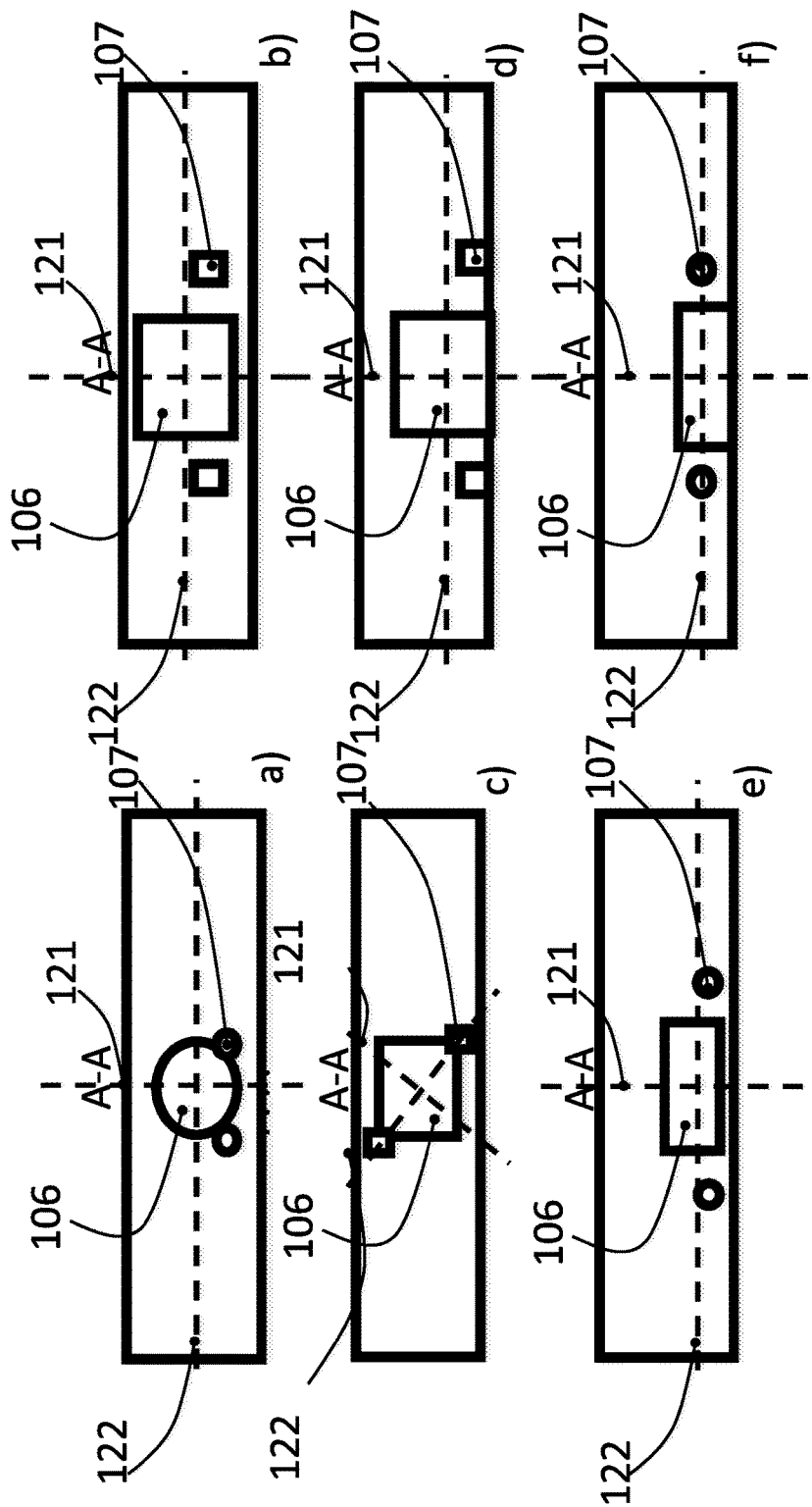
FIGS. 4a to 4k show cross-sectional views through orifice plates of different types for providing the swirling jet stream.

FIG. 4a shows a configuration where the main orifice 106 and the control orifices 107 both have a circular cross-section (in the flow direction), wherein the outer walls of the control orifices 107 abut the outer wall of the main orifice 106 with the control orifices 107 being symmetrically arranged with respect to the first axis 121 and offset with respect to the second axis 122.

In FIG. 4b, the cross-sectional shapes of the main orifice 106 and the control orifices 107 are square, with the control orifices 107 being symmetrically arranged with respect to the first axis 121 and offset from a second axis 122.

In FIG. 4c, the main orifice 106 and the control orifices 107 still have square cross-sections, while a first axis 121 is inclined towards the heat transfer surface 120. The control orifices 107 are symmetrically arranged with respect to the first axis 121 and arranged on the second axis 122 (no offset), with both axes 121, 122 going through a center of the main orifice 106 and being perpendicular to the flow direction.

FIG. 4d shows an orifice group 115 where the main orifice 106 and the control orifices 107 are arranged in the orifice plate 105, both having edges which are aligned with the heat transfer surface 120 or the end of the orifice plate 105 in offset displacement direction, respectively.

FIG. 4e shows a main orifice 106 having a rectangular shape in cross-section, with the control orifices 107 being arranged symmetrically along the first axis 121 and offset from a second axis 122 having a circular cross-sectional shape. The rectangular-shaped cross-section of the main orifice 106 has its longer dimension parallel to the heat transfer surface 120 and its shorter dimension in a direction perpendicular to the heat transfer surface 120.

FIG. 4f shows an arrangement where the rectangular-shaped cross-section of the main orifice 106 abuts the heat transfer surface 120, while two control orifices 107 are arranged symmetrically with respect to the first axis 121 and along the second axis 122, having no offset therefrom.

In FIG. 4g, the main orifice 106 has an elliptical shape in cross-section, while the longer dimension of the elliptical shape is parallel to the heat transfer surface 120. The control orifices 107 are arranged symmetrically with respect to the first axis 121 and offset from the second axis 122 and have a rectangular cross-sectional shape, also with its longer dimension parallel to a heat transfer surface 120.

FIG. 4h shows the main orifice 106 having an elliptical shape with a longer dimension parallel to the heat transfer surface 120 and with control orifices 107 having an edge which abuts either the heat transfer surface 120 or an end in direction of the offset displacement, respectively.

FIG. 4i shows an orifice group 115 with a main orifice 106 having an elliptical shape in cross-section, with its longer dimension parallel to the heat transfer surface 120 and with control orifices 107 symmetrically arranged with respect to the first axis 121 and offset from a second axis 122, wherein the control orifices 107 have an elliptical shape with its longer dimension perpendicular to the heat transfer surface 120, i.e. perpendicular to the direction of the longer dimension of the main orifice 106.

FIG. 4j shows an orifice group 115 with a main orifice 106 having a rectangular shape in cross-section, with its longer dimension perpendicular to the heat transfer surface 120 and with control orifices 107 symmetrically arranged with respect to the first axis 121 and offset from a second axis 122 perpendicular thereto, wherein the control orifices 107 have a rectangular shape with its longer dimension in parallel to the heat transfer surface 120, i.e. perpendicular to the direction of the longer dimension of the main orifice 106.

FIG. 4k shows an orifice group 115 with a main orifice 106 having a circular shape in cross-section and three circular control orifices 107 symmetrically arranged with respect to the three symmetry axes (symmetry lines) 131, 132 133 arranged by an angle of 60° with respect to each other. Each two of the control orifices 107 are symmetrically arranged with respect to one of the symmetry axes. Generally, this concept is adaptable to different cross-section shapes and orientations of the orifices 106, 107 and scalable to more than three control orifices 107 being symmetrically arranged around the main orifice 106 with respect to a corresponding number of symmetry axes.

Figure 5:
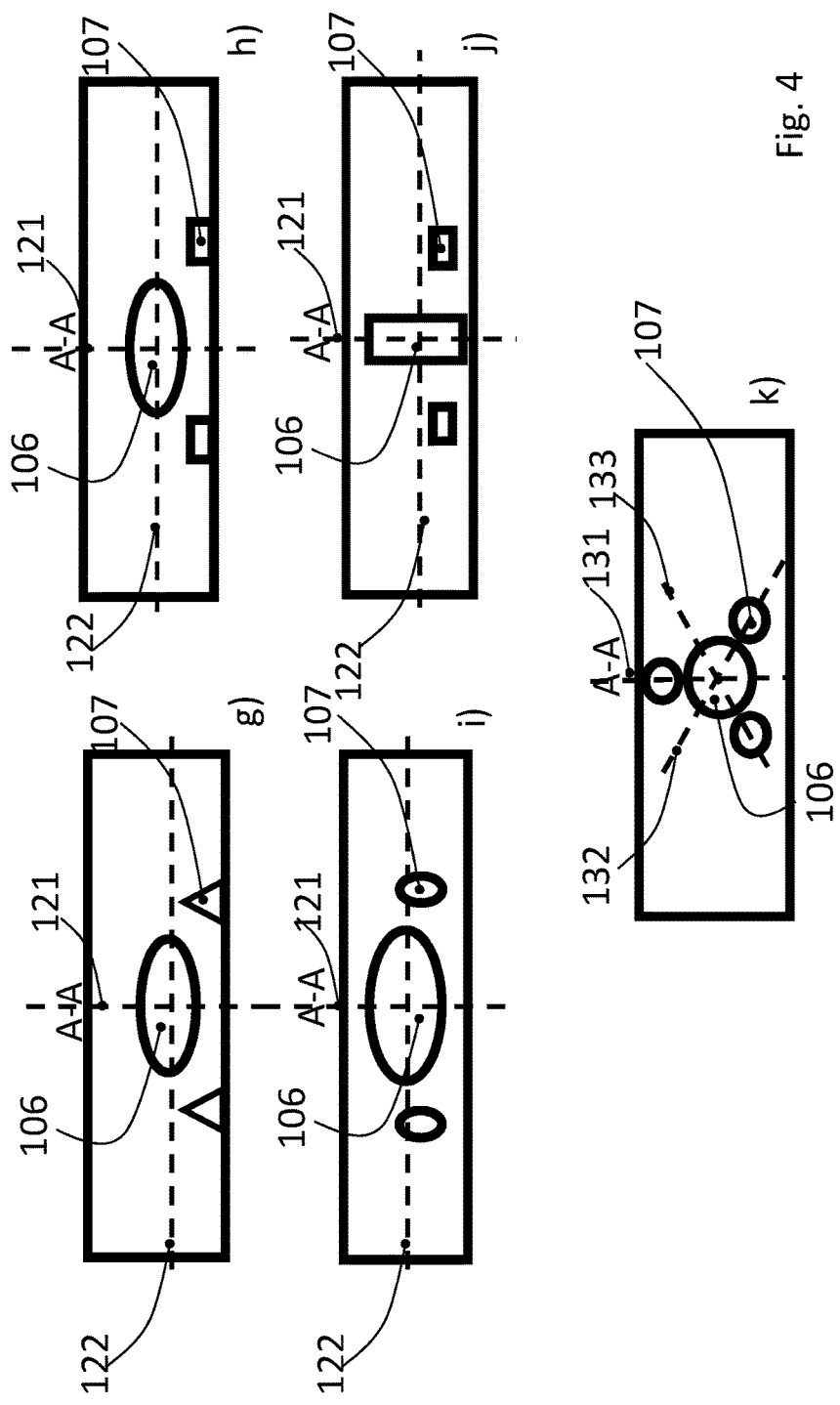
FIG. 5 shows a perspective cross-sectional view of a heat exchanging device with orifice groups of different types.

In FIG. 5, a perspective view of the interior of the heat exchanging apparatus 100 is shown with the orifice plate 105 having orifice groups 115 with orifices having different shapes, arrangements and displacements with respect to each other. It can be seen that the swirling of the main jet-stream F can be achieved irrespective of the (cross-sectional) shape the main orifice 106 or the control orifices 107. To compact the orifice group 115 aligned in the orifice plate 105, two neighboring orifice groups 115 can be configured to overlap, so that for a first orifice group 115, the control orifices 107 have an offset towards the heat transfer surface 120 with respect to the second axis 122, wherein the neighboring orifice group 115 has control orifices 107 which are offset with respect to the second axis 122 away from the heat transfer surface 120. This may lead to an overlapping of control orifices 107 of neighboring orifice groups 115 in the direction of alignment of the orifice groups 115.

Figure 6:
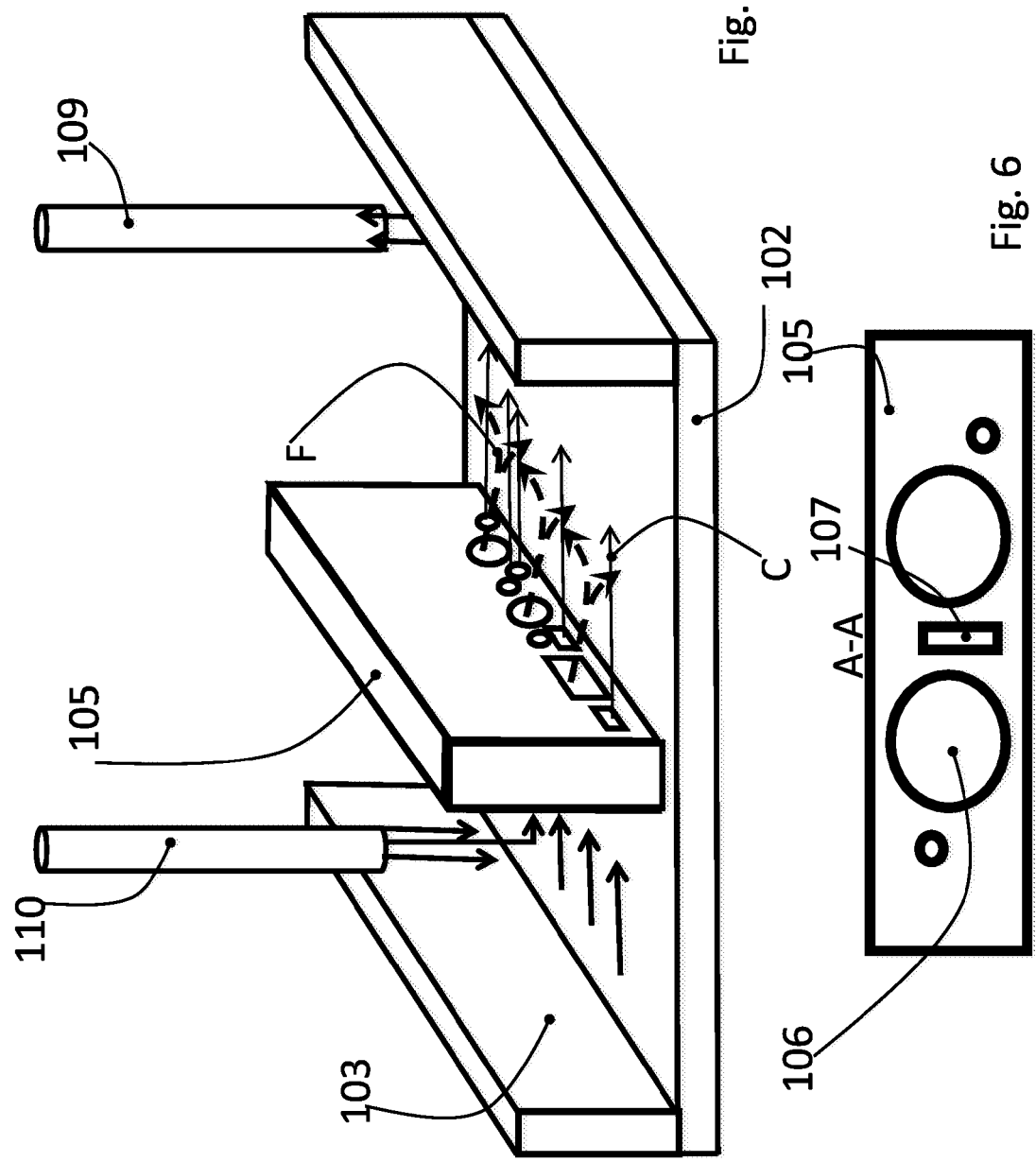
FIG. 6 shows a cross-sectional view of the orifice plate with a reduced number of control orifices for providing the swirling jet-streams.

According to a further embodiment, the orifice groups 115 can be as shown in FIG. 6, i.e. having two or more adjacent main orifices 106 wherein each two of the main orifices 106 are serviced by one common control orifice 107' located between the two adjacent main orifices 106. Common control orifices 107' which are located between two adjacent main orifices 106 can have a different shape (rectangular in FIG. 6) and an orientation of its longer cross sectional dimension perpendicular to the direction of alignment of the main orifices 106. Additionally or alternatively, control orifices 107 which are not commonly associated to two adjacent main orifices may have different offsets from a cross axis (symmetry line of the main orifices). Such an arrangement may particularly replace configurations of overlapping control orifices 107, as indicated in the embodiment of FIG. 5. According to one embodiment the control orifices are located with the same distance from the two adjacent main orifices 106.

In FIG. 7, a second heat exchanging apparatus 200 is shown having elements substantially similar to those of the first heat exchanging apparatus 100. Identical elements or elements having a similar function are indicated by identical two last numbers in the reference signs.

Thus, the second heat exchanging apparatus 200 has two housing plates 202 spaced apart by an enclosure element 208 forming an enclosure with an inlet manifold 203 and a chamber 204. An orifice plate 205 having orifice groups 215*a*, 215*b* is provided to separate the inlet manifold 203 from the chamber 204. A supply port 210 is arranged at the enclosure element 208 which encompasses the chamber 204 and the inlet manifold 203, while the discharge port 209 is also arranged substantially on an end opposite the enclosure element 208.

The control jet-streams C generated by the control orifices 207*a*, 207*b* cause a constant dynamic pressure imbalance with respect to the main jet-stream F. Since the control jet-streams C are close to the main jet-stream F, the pressure imbalances interact with the main jet-stream F, so that the main jet-stream F alternatively swings between the stream paths 211*a*, 212*a*, 213*a*, 211*b*, 212*b* and 213*b* creating the swirling jets 214*a*, 214*b*.

In contrast to the first heat exchange apparatus 100 both housing plates 202 serve as heat transfer surfaces 220, therefore orifice plate 205 may contain two sets of orifice groups 215, each associated with one of the heat transfer surfaces 220.

In FIG. 8, a cutout cross-sectional view along the cutting plane A-A is shown and it can be seen that two main orifices 206*a*, 206*b* of two orifice groups 215*a*, 215*b* are shown, each of which is accompanied by two control orifices 207*a*, 207*b*. However, the control orifices 207*a*, 207*b* are offset from their second axes 222*a*, 222*b* in different directions so as to curve the swirling jets 214*a*, 214*b* towards a respective one of the heat transfer surfaces 220.

In FIG. 9, a third heat exchanging apparatus 300 is illustrated having elements substantially similar to those of the first heat exchanging apparatus 100. Identical elements or elements having a similar function are indicated by identical last two numbers in the reference signs.

Thus, the third heat exchanging apparatus 300 has two housing plates 302 spaced apart by an enclosure element 308 forming an enclosure of a housing 301 with a first and a second inlet manifold 303*a*, 303*b* and a chamber 304 between the first and the second inlet manifold 303*a*, 303*b*. A first orifice plate 305*a* to separate the first inlet manifold 303*a* from the chamber 304 and having orifice groups 315*a*, 315*b* is provided. A first and a second supply port 310*a*, 310*b* are arranged at opposite ends of the enclosure element 308 which encompasses the chamber 304 and the inlet manifolds 303*a*, 303*b* to supply heat carrier medium into the inlet manifolds 303*a*, 303*b*. A discharge port 309 is provided through one of the housing plates 302 opposite to the heat transfer surface 320 to discharge the heat carrier medium from the chamber 304.

Each of the orifice plates 305*a*, 305*b* has a plurality of orifice groups 315*a*, 315*b* aligned substantially parallel to the heat transfer surface 320. As above, the orifice groups 315*a*, 315*b* each have a main orifice 306*a*, 306*b* and control orifices 307*a*, 307*b* associated thereto, respectively.

The control jet-streams C generated by the control orifices 307*a*, 307*b* cause a constant dynamic pressure imbalance with respect to the main jet-stream F. Since the control jet-streams C are close to the main jet-stream F, the pressure imbalances interact with the main jet-stream F, so that the main jet-stream F alternatively swings between the stream paths 311*a*, 312*a*, 313*a*, 311*b*, 312*b* and 313*b* creating the swirling jets 314*a*, 314*b*.

FIGS. 10*a* and 10*b* show cross-sectional views of the first and second orifice plates 305*a*, 305*b* along the cutting planes A-A and B-B, respectively. It can be seen that the first orifice plate 305*a* (FIG. 10*a*) on the left-hand side has its orifice groups 315*a* displaced from the heat transfer surface 320 with a smaller distance than the orifice groups 315*b* of the second orifice plate 305*b* on the right-hand side. The resulting swirling jets 314*a*, 314*b* are directed towards each other, but impinge on the heat transfer surface 320 at different angles due to the different distance of the respective orifice groups 315*a*, 315*b* from the heat transfer surface 320.

Figure 11:
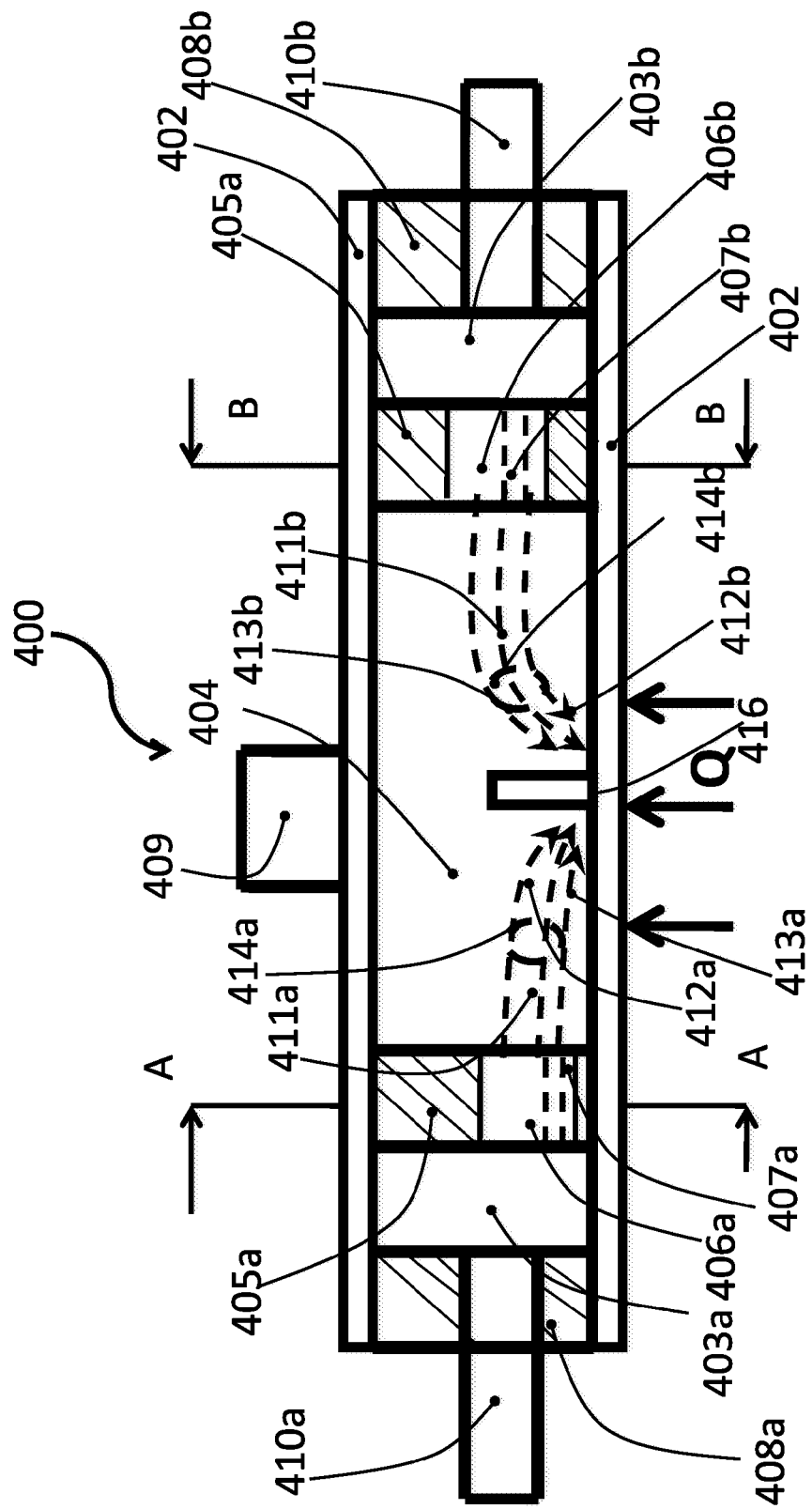
FIG. 11 shows a cross-sectional view of a fourth heat exchanging apparatus with a heat transfer surface being provided with a structure.

FIG. 11 shows a fourth heat exchanging apparatus 400 which is similar to the third heat exchanging apparatus 300 of FIG. 9. In FIG. 11, identical elements or elements having a similar function are indicated by identical last two numbers in the reference signs.

Thus, the fourth heat exchanging apparatus 400 has two housing plates 402 spaced apart by an enclosure element 408 which encompasses a chamber 404 and forming an enclosure of a housing 401. The enclosure of the housing 401 includes a first and a second inlet manifold 403*a*, 403*b* and the chamber 404 between a first and the second orifice plates 405*a*, 405*b*. A first orifice plate 405*a* incorporates one or more orifice groups 415*a*, each consisting of main orifice 406*a* and two or more control orifices 407*a* per each main orifice 406*a*. The second orifice plate 405*b* incorporates one or more orifice groups 415*b*, each consisting of main orifice 406*b* and two or more control orifices 407*b* per each main orifice 406*b*. A first and a second supply port 410*a*, 410*b* are arranged at opposite ends of the housing 401 and supply the heat carrier medium into the inlet manifolds 403*a* and 403*b*. A discharge port 409 is provided through the housing plate 402, opposite the heat transfer surface 420 to discharge the heat carrier medium from the chamber 404. The corresponding orifice groups 415*a*, 415*b* including the main orifices 406*a*, 406*b* and the control orifices 407*a*, 407*b* are arranged as shown in FIGS. 10*a* and 10*b*.

In contrast to the third heat exchanging apparatus 300, the heat transfer surface 420 is provided with one or more pin 416 as elevated structures.

As shown in FIGS. 11*a* and 11*b*, the heat transfer surface 420 may be provided with a structure of elevated pins 416 arranged, for at least one orifice group 415, two rows of a plurality of pins (here 3) aligned in the direction of flow from the control orifice 407. Pins 416 in at least a first row are located directly in front (downstream) of a control orifice 407 splitting flow from it into two stream paths. This creates control jet-streams of reduced sizes while utilizing relatively large (in terms of cross-sectional area) control orifices 407 allowing for more precise control while making manufacturing more economical. It also allows generating deeper swirling zones by including further rows of pins 416 into swirling creating process As shown in FIGS. 11c and 11d, the heat transfer surface 420 may be provided additionally with a structure of elevated pins 416 arranged in one row of a plurality of pins (here 2) aligned in the direction of flow from the main orifice 406. Additionally to the row of pins in front of the control orifices 406 pins 416 in at least a further row are located directly in front (downstream) of the main orifice 406 splitting main jet-stream into two stream paths. This creates main jet-streams of reduced sizes while utilizing relatively large (in terms of cross-sectional area) main orifices 406 making manufacturing more economical. The pin rows associated to the control orifices and the pin rows associated to the main orifices might be arranged staggered.

Figures 12, 13:
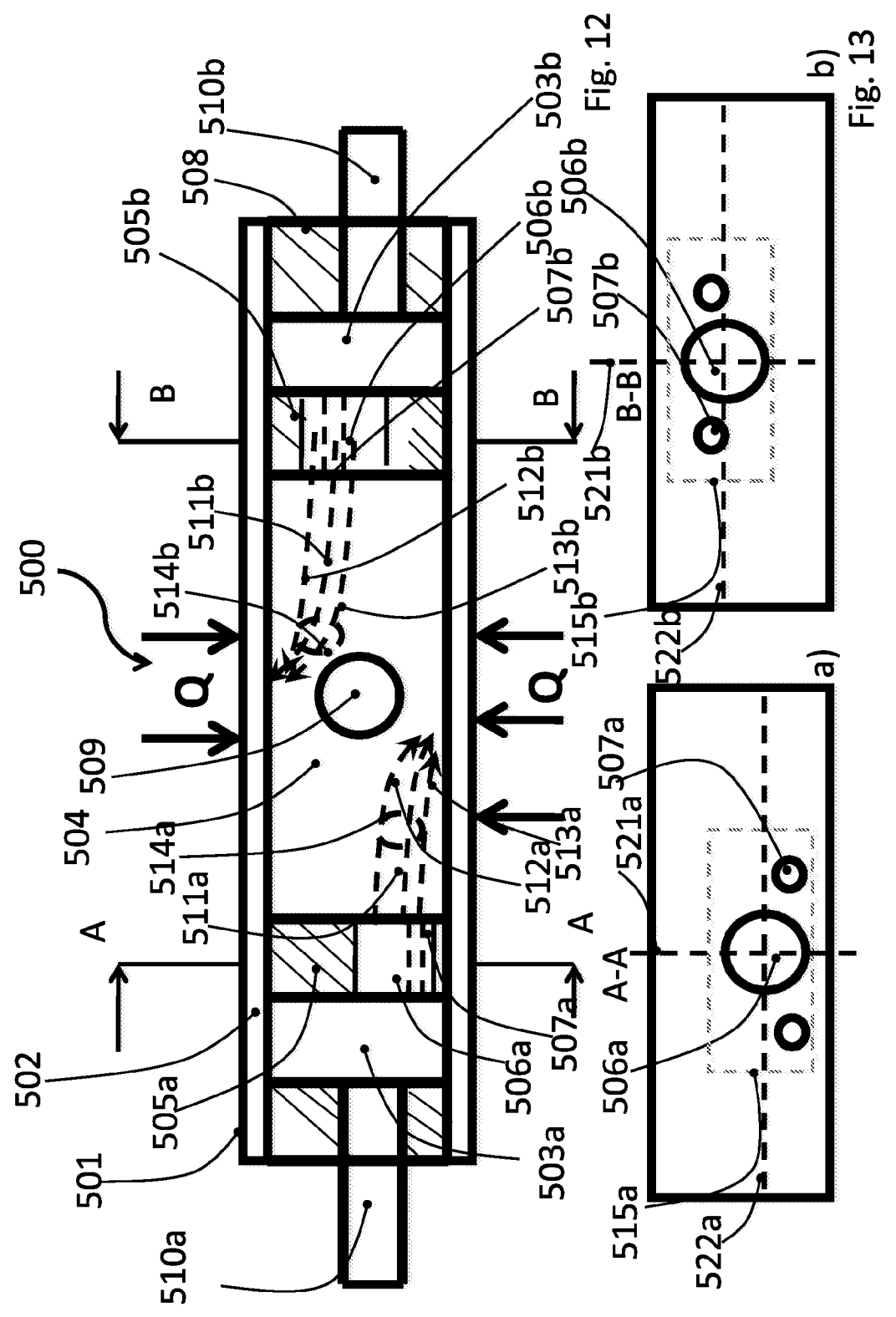

FIG. 12 shows a fifth heat exchanging apparatus, wherein identical elements or elements having a similar function are indicated by identical last two numbers in the reference signs.

Thus, the fifth heat exchanging apparatus 500 has two housing plates 502 spaced apart by an enclosure element 508 forming an enclosure of a housing 501 with a first and a second inlet manifold 503a, 503b and a chamber 504 between the first and the second inlet manifold 503a, 503b. A first orifice plate 505a to separate the first inlet manifold 503a from the chamber 504 and having orifice groups 515a and a second orifice plate 505b to separate the second inlet manifold 503b from the chamber 504 and having orifice groups 415b are provided. A first and a second supply port 510a, 510b are arranged at opposite ends of the enclosure element 508 which encompasses the chamber 504 and the inlet manifolds 503a, 503b to supply heat carrier medium into the inlet manifolds 503a, 503b. A discharge port 509 is provided on another side of the enclosure element 508 to discharge the heat carrier medium from the chamber 504.

The corresponding orifice groups 515a, 515b are arranged as shown in FIGS. 13a and 13b. In the present embodiment, the orifice groups 515a of the first orifice plate 505a comprise control orifices 507a with an offset displaced towards one (the lower) of the housing plates 502 and the orifice groups 515b of the second orifice plate 505b comprise control orifices 507b with an offset displaced towards another (the upper) of the housing plates 502.

In contrast to the fourth embodiment, both housing plates 502 forming the housing 501 provide a heat transfer surface 520 while the discharge port 509 is also arranged at the side of the enclosure element 508 which forms the enclosure of the housing 501. The orifice plates 505a, 505b are each provided with one or more orifice groups 515a, 515b, both of which include orifice groups from which the swirling jet 514 is directed to one or both of the heat transfer surfaces 520, so that with both orifice plates 505a, 505b swirling jets 514a, 514b are directed to both heat transfer surfaces 520.

Figure 14:
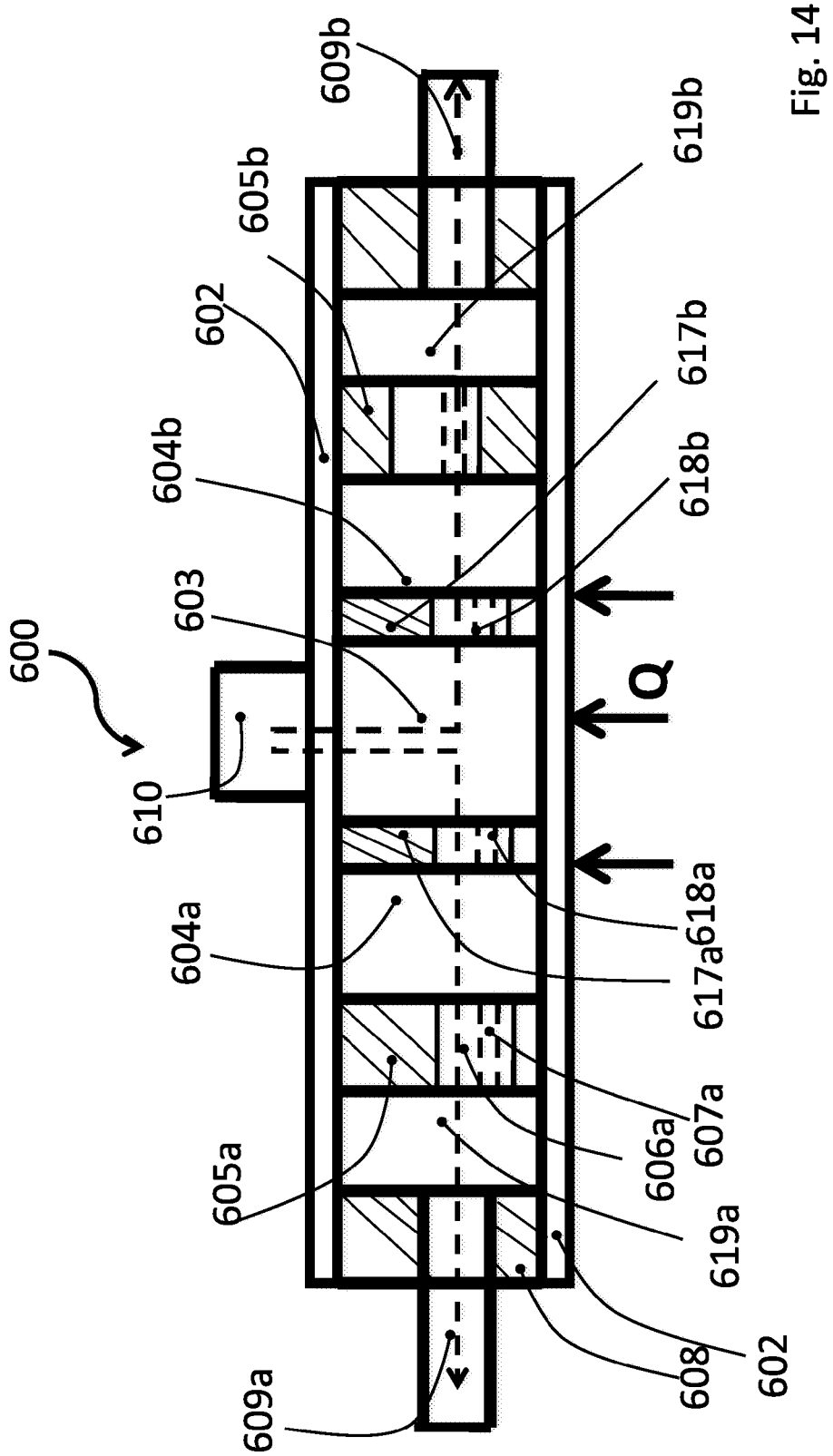
FIG. 14 shows a cross-sectional view of a sixth heat exchanging apparatus, wherein the enclosure is separated into a number of cells.

FIG. 14 shows a sixth heat exchanging apparatus 600 similar to the third heat exchanging apparatus 300 shown in FIG. 9. Identical elements or elements having a similar function are indicated by identical last two numbers in the reference signs.

Thus, the sixth heat exchanging apparatus 600 has two housing plates 602 spaced apart by an enclosure element 608 forming an enclosure of a housing 601 with an inlet manifold 603, first cell chambers 604a, 604b, and second cell chambers 619a, 619b. First cell chambers 604a, 604b are created between first orifice plates 605a, 605b each containing one or more orifice groups 615a, 615b and second orifice plates 617a, 617b containing one or more orifice groups 618a, 618b, respectively.

Second cell chambers 619a, 619b are created between the first orifice plates 605a, 605b each containing one or more first orifice groups 615a, 615b and enclosure element 608 which encompasses the first order cell chambers 604a, 604b and the second cell chambers 619a, 619b. A first and a second discharge ports 609a, 609b are arranged at opposite ends of the enclosure element 608. A supply port 610 is provided through one of the housing plates 602 opposite the heat transfer surface 620 to supply the heat carrier medium to the second cell chambers 619a, 619b which act as supply manifolds.

Each of the first and second orifice plates 605a, 605b, 617a, 617b has a plurality of orifice groups 615a, 615b which can be aligned substantially parallel to the heat transfer surface 620.

Figure 14A:
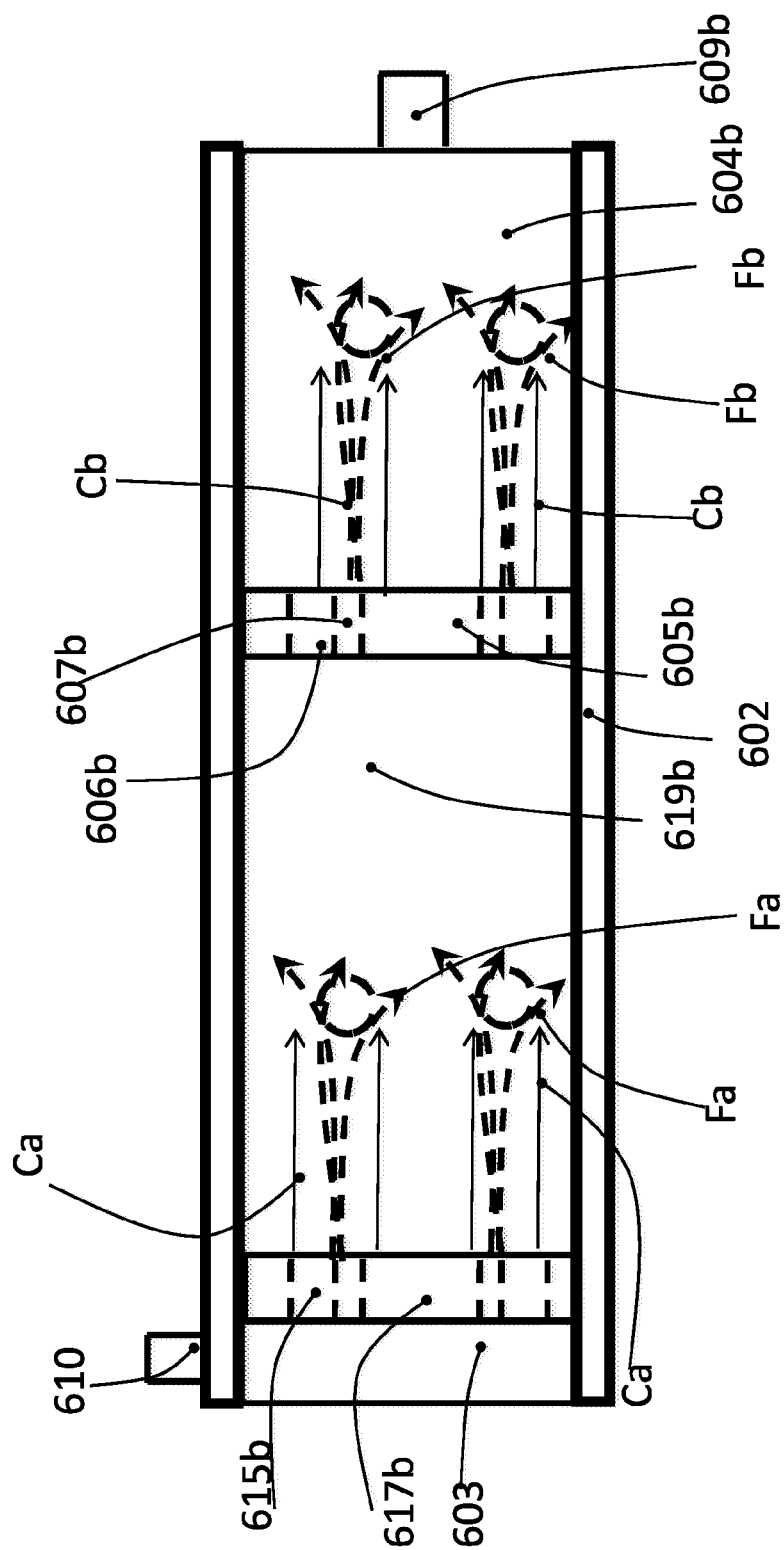
FIG. 14a shows a top cross-sectional view onto the sixth heat exchanging apparatus of FIG. 14.

As shown in the top cross-sectional view of FIG. 14a, the control jet-streams Ca generated by the control orifices in second orifice plates 617b, within the (left) first cell chamber 604b cause a constant dynamic pressure imbalance with respect to the main jet-stream Fa within first cell chamber 604b. Since, within first cell chamber 604b, the control jet-streams Ca are close to the main jet-stream Fa, the pressure imbalances interact with the main jet-stream Fa, so that the main jet-stream Fa alternatively swings between the stream paths 611b, 612b and 613b creating the swirling jet 614b.

Similarly, the control jet-streams Cb generated by the control orifices in first orifice plate 605b within second cell chamber 619b cause a constant dynamic pressure imbalance with respect to the main jet-stream Fb within second cell chamber 619b. Since within second cell chamber 604b the control jet-streams Cb are close to the main jet-stream Fb, the pressure imbalances interact with the main jet-stream Fb creating a second swirling jet.

Although not specifically shown in the drawings, the same configuration is mirrored for the left side of FIG. 14, concerning elements 604a, 605a, 617a, 619a.

In contrast to the third heat exchanging apparatus 300 of FIG. 9, the chamber is comprised of a plurality of cascaded cell chambers of at least two types: the first cell chamber 604a, 604b defined by first and second orifice plates 605a, 605b and 617a, 617b; and the second cell chambers 619a, 619b defined by at least one first orifice plate 605a and enclosure element 608.

It is possible to cascade more than two cell chambers in series between the supply port 610 and one discharge port 609 in the above described manner.

First orifice plates 605a and 605b contain each at least one orifice group 615a and 615b respectively. Each orifice group 615a, 615b is comprised of a main orifice 606a, 606b and at least two control orifices 607a, 607b. Orifice plates 617a and 617b contain each at least one orifice group 618a and 618b respectively. Orifice plates 605a, 605b and 617a, 617b might be either identical to each other or different from each other, containing different number of orifice groups, or orifice groups of various shapes, orientations, configurations and profiles. This allows to achieve uniform temperature distribution under uneven distribution of the intensity of heat exchange, eliminating possibility of local overheating within serviced equipment.

FIG. 15 shows a seventh heat exchanging apparatus which substantially corresponds to the first heat exchanging apparatus 100.

The seventh heat exchanging apparatus 700 has elements substantially similar to those of the first heat exchanging apparatus 100. Identical elements or elements having a similar function are indicated by identical last two numbers in the reference signs.

Thus, the seventh heat exchanging apparatus 700 has two housing plates 702 spaced apart by an enclosure element 708 forming an enclosure with an inlet manifold 703 and a chamber 704. An orifice plate 705 having one or more orifice groups 715 is provided to separate the inlet manifold 703 from the chamber 704. A supply port 710 is arranged at the enclosure element 704 which encompasses the chamber 704 and the inlet manifold 703, while the discharge port 709 is also arranged substantially on an end opposite the enclosure element 708.

The control jet-streams C generated by the control orifices 707 cause a constant dynamic pressure imbalance with respect to the main jet-stream F. Since the control jet-streams C are close to the main jet stream F, the pressure imbalances interact with the main jet-stream F, so that the main jet stream F alternatively swings between stream paths 711, 712, 713 creating the swirling jet 714.

In contrast to the first heat exchanging apparatus 100, the orifices may be tapered (cone-shaped) along the flowing direction of the heat carrier medium from the inlet manifold 703 to the chamber 704, so that the inlet of each orifice has a larger cross-section than the outlet thereof. The tapering of orifices can be applied to any of the orifices of the embodiments described herein. Furthermore, only one of the main orifice 706 and the control orifices 707 can be tapered while the respective other one has a substantially cylindrical shape (cross-section parallel to flow direction).

FIG. 16 shows a cross-sectional view of the cutting plane indicated by A-A in FIG. 15. It can be seen that each of the nozzles, i.e. the main orifice 706 and the control orifices 707 which are exemplarily shown with a circular shape, but not limited thereto, is provided with a cross-section narrowing towards the chamber 704.

The tapering of each of the corresponding orifices 706, 707 can be directed in both ways either widening towards the chamber 704 or narrowing towards the chamber 704 depending on the effect to be achieved. If hydraulic resistance shall be decreased the orifices should widen towards the chamber 704 if the turbulization should be spread over a larger area of the heat transfer surface the orifices should narrowing towards the chamber 704.

FIG. 17 shows an eighth heat exchanging apparatus 800 of the type of the third heat exchanging apparatus 300 of FIG. 9. The eighth heat exchanging apparatus 800 has elements substantially similar to those of the third heat exchanging apparatus 300. Identical elements or elements having a similar function are indicated by identical last two numbers in the reference signs.

Thus, the eighth heat exchanging apparatus 800 has two housing plates 802 spaced apart by an enclosure element 808 forming an enclosure of a housing 801 with a first and a second inlet manifold 803*a*, 803*b* and a chamber 804 between the first and the second inlet manifold 803*a*, 803*b*. A main orifice plate 805*a* separates inlet manifold 803*a* from a chamber 804 and contains one or more main orifices 806, while a control orifice plate 805*b* separates inlet manifold 803*b* from a chamber 804 and contains at least two control orifices 807 for each main orifice 806 located in the main orifice plate 805. A first and a second supply port 810*a*, 810*b* are connected to the inlet manifolds 803*a*, 803*b* to supply heat carrier medium into the inlet manifolds. A discharge port 809 is provided through one of the housing plates 802 opposite the heat transfer surface 820 to discharge the heat carrier medium from the chamber 804.

In contrast to the third embodiment, the main orifices 806 are located in the main orifice plate 805*a* and the control orifices 807 are located in control orifice plate 805*b*, wherein the main orifice plate 805*a* and the control orifice plate 805*b* oppose each other. One main orifice 806 and the associated control orifices 807 form one orifice group 815 as explained above. While the main orifice plate 805*a* is supplied with the heat carrier medium through a first supply port 810*a* through a first manifold 803*a*, the control orifice plate 805*b* is supplied with the heat carrier medium through a second supply port 810*b* through a second manifold 803*b*. Orifice plates 805*a* and 805*b* are arranged in such a way that each main orifice located in the main orifice plate 805*a* is located straight in between corresponding control orifices located in control orifice plate 805*b*. This arrangement allows to achieve better control and elimination of local overheating spots when area of local overheating is comparable in size with cross-section of the created jet-stream itself.

In other words, the main orifices 806 and the control orifices 807 are arranged opposite each other, so that a main jet-stream F and control jet-streams C are generated having opposite flowing directions while still interacting with each other causing the main jet-stream F to swirl as described in more detail in conjunction with the first heat exchanging apparatus 100 of FIG. 1.

FIG. 18*a* shows a cross-section of the first orifice plate 805*a* along the plane A-A, and FIG. 18*b* shows a cross-section of the second orifice plate along the plane B-B. While the main orifice 806 is not tapered, the control orifices 807 have a tapered profile, wherein the outlet opening is widening towards the chamber 804.

The invention claimed is:

1. A jet-flow heat exchanging device for transferring heat from or to one or more heat transfer surfaces, comprising:
   one or more orifice groups, each for directing a heat carrier medium onto the heat transfer surface; wherein at least one of the orifice groups includes:
   a main orifice for generating a main jet-stream; and
   at least two control orifices associated with the main orifice, wherein the control orifices are configured
      to have a smaller cross-section than the main orifice;
      to be arranged symmetrically around a first axis going through the center of the main orifice, wherein the first axis is perpendicular to the flow direction through the main orifice and perpendicular to the heat surface transfer surface in a chamber;
      to be offset from a second axis towards the heat transfer surface, the second axis going through the center of the main orifice and being perpendicular to the first axis and to the flow direction, and
      to have a distance from the main orifice of between 1% and 80% of the largest cross-sectional dimension of the main orifice, respectively; in order to generate control jet-streams for interacting with the main jet-stream, so as to cause the heat carrier medium of the main jet-stream to swirl.

2. The device according to claim 1, wherein the flow directions of the at least two control jet-streams are either identical with the flow direction of the main jet-stream or opposite thereto.

3. The device according to claim 1, wherein an area of a cross-section of the at least two control orifices is about 1 to 60% of the area of the cross-section of an opening of the main orifice directed to the heat transfer surface.

4. The device according to claim 1, wherein three or more control orifices are symmetrically arranged around the main orifice of a respective orifice group, wherein symmetry lines go through the geometrical center of the main orifice the number of which corresponds to the number of control orifices associated to the main orifice.

5. The device according to claim 1, wherein each of the main orifices as well as each of the control orifices of each orifice group has an individual cross-section respectively selected from one of a square, rectangular, triangular, circular and elliptical cross-section.

6. The device according to claim 1, wherein the orientations of the cross sectional shapes of the main orifices and/or the control orifices of each orifice group are different.

7. The device according to claim 1, wherein one or more orifice groups are supplied by an inlet manifold having a common volume configured to supply the heat carrier medium to each orifice within each orifice group.

8. The device according to claim 1, wherein one or more orifice groups are incorporated into a orifice plate in a straight alignment substantially parallel to the heat transfer surface.

9. The device according to claim 1, wherein one or more heat transfer surfaces are included in an enclosure through which the heat carrier medium is passed.

10. The device according to claim 1, wherein one or more heat transfer surfaces include one or more protrusions and/or one or more dimples arranged relative to one of the orifice groups, so that the main jet stream (F) of at least one of the orifice groups engages with the one or more protrusions and/or the one or more dimples.

11. The device according to claim 1, wherein one or more chambers are provided which include one or more heat transfer surfaces, wherein the one or more chambers are limited by at least one orifice plate including the one or more orifice groups.

12. The device according to claim 11, wherein a plurality of chambers are serially arranged within an enclosure of a housing of the device.

13. A system comprising:
- a jet-flow heat exchanging device for transferring heat from or to one or more heat transfer surfaces, wherein the jet-flow heat exchanging device comprises one or more orifice groups, each for directing a heat carrier medium onto the heat transfer surface, and wherein at least one of the orifice groups includes a main orifice for generating a main jet-stream and at least two control orifices associated with the main orifice, wherein the control orifices are configured
  - to have a smaller cross-section than the main orifice;
  - to be arranged symmetrically around a first axis going through the center of the main orifice, wherein the first axis is perpendicular to the flow direction through the main orifice and perpendicular to the heat surface transfer surface in a chamber;
  - to be offset from a second axis towards the heat transfer surface, the second axis going through the center of the main orifice and being perpendicular to the first axis and to the flow direction, and
  - to have a distance from the main orifice of between 1% and 80% of the largest cross-sectional dimension of the main orifice, respectively, in order to generate control jet-streams for interacting with the main jet-stream, so as to cause the heat carrier medium of the main jet-stream to swirl; and
- an element providing the heat transfer surface or being thermally coupled to the heat transfer surface.

\* \* \* \* \*